(12) United States Patent
Siniaguine

(10) Patent No.: US 6,323,134 B1
(45) Date of Patent: Nov. 27, 2001

(54) PLASMA PROCESSING METHODS AND APPARATUS

(75) Inventor: Oleg Siniaguine, Santa Cruz, CA (US)

(73) Assignee: Tru-Si Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/519,281

(22) Filed: Mar. 7, 2000

Related U.S. Application Data

(62) Division of application No. 08/975,403, filed on Nov. 20, 1997, now Pat. No. 6,139,678.

(51) Int. Cl.$^7$ .................. H01L 21/302; H01L 21/461
(52) U.S. Cl. .................. 438/716; 438/716; 438/748; 438/712; 438/706; 204/298.01; 204/298.28
(58) Field of Search .................. 438/716, 689–706, 438/708–714, 748; 204/298.01–298.36, 192.1, 192.3, 192.32–192.35; 29/603.15–603.18

(56) References Cited

U.S. PATENT DOCUMENTS

| | | | |
|---|---|---|---|
| 4,315,960 | 2/1982 | Ohji et al. | 427/248 |
| 4,416,760 | 11/1983 | Turner | 204/298 |

(List continued on next page.)

FOREIGN PATENT DOCUMENTS

| | | | |
|---|---|---|---|
| WO 9632742 A | 10/1996 | (EP) | . |
| 0 807 964 A1 | 11/1997 | (EP) | . |
| WO 9745857 A | 12/1997 | (EP) | . |
| 59-112624 A | 6/1984 | (JP) | . |
| 3-284839 A | 12/1991 | (JP) | . |
| 60-24018 A | 2/1994 | (JP) | . |
| WO 92/12273 | 7/1992 | (WO) | . |
| WO 92/12610 | 7/1992 | (WO) | . |
| WO 96/21943 | 7/1996 | (WO) | . |
| Wo 97/45856 | 12/1997 | (WO) | . |

OTHER PUBLICATIONS

Lieberman, Michael A. et al., "Principles of Plasma Discharges and Materials Processing" (John Wiley & Sons, New York, 1994), p. 1.

(List continued on next page.)

*Primary Examiner*—Matthew Smith
*Assistant Examiner*—Granvill D Lee, Jr.
(74) *Attorney, Agent, or Firm*—Skjerven Morrill MacPherson, LLP; Michael Shenker

(57) ABSTRACT

To move an article in and out of plasma during plasma processing, the article is rotated by a first drive around a first axis, and the first drive is itself rotated by a second drive. As a result, the article enters the plasma at different angles for different positions of the first axis. The plasma cross-section at the level at which the plasma contacts the article is asymmetric so that those points on the article that move at a greater linear velocity (due to being farther from the first axis) move longer distances through the plasma. As a result, the plasma processing time becomes more uniform for different points on the article surface. In some embodiments, two shuttles are provided for loading and unloading the plasma processing system. One of the shuttles stands empty waiting to unload the processed articles from the system, while the other shuttle holds unprocessed articles waiting to load them into the system. After the plasma processing terminates, the empty shuttle unloads processed articles from the system, takes the articles away, and gets unloaded and reloaded with unprocessed articles. Meanwhile, the other shuttle loads unprocessed articles into the system and the plasma processing begins. Since the plasma processing system does not wait for the first shuttle, the productivity of the system is increased.

28 Claims, 7 Drawing Sheets

U.S. PATENT DOCUMENTS

| | | | |
|---|---|---|---|
| 4,714,536 | * 12/1987 | Freeman et al. | 204/298 |
| 5,029,555 | 7/1991 | Dietrich et al. | 118/730 |
| 5,204,145 | 4/1993 | Gasworth | 427/577 |
| 5,238,532 | 8/1993 | Zarowin et al. | 156/643 |
| 5,282,921 | 2/1994 | Poultney | 156/626 |
| 5,291,415 | 3/1994 | Zarowin et al. | 364/474.3 |
| 5,308,461 | 5/1994 | Ahonen | 204/192.11 |
| 5,312,510 | 5/1994 | Poultney | 156/345 |
| 5,365,031 | 11/1994 | Mumola | 219/121.43 |
| 5,474,642 | 12/1995 | Zorina et al. | 156/345 |
| 5,558,909 | 9/1996 | Poliquin et al. | 427/251 |
| 5,665,167 | 9/1997 | Deguchi et al. | 118/728 |
| 5,767,627 | 6/1998 | Siniaguine | 315/111.41 |
| 5,811,021 | 9/1998 | Zarowin et al. | 216/67 |
| 5,834,730 | 11/1998 | Suzuki et al. | 219/121.43 |
| 5,882,165 | * 3/1999 | Maydan et al. | 414/217 |
| 6,105,534 | * 8/2000 | Siniaguine et al. | 118/723 |
| 6,244,811 | * 6/1999 | Kroeker et al. | 414/217 |

OTHER PUBLICATIONS

Agrikov et al., "Dynamic Plasma Treament of HIC (Hybrid Integrated Circuit) Substrates", Elektronnaya Tehnika, Ser, 10, 5(71), 1988, pp. 30–32.

Agrikov et al., "Foundations of a Realization of a Method of Dynamic Plasma Treatment of a Surface of a Solid Body", Plazmohimiya–87, Part 2 (U.S.S.R. Academy of Science, Institut Neftehimicheskogo Sinteza im. A.V. Topchieva, Moscow, 1987), 1988, pp. 58–96.

Kulik, "Dynamic Plasma Treatment (DPT) of a Surface of a Solid Body", Plazmohimiya–87, Part 2 (U.S.S.R. Academy of Science, Institut Neftehimicheskogo Sinteza im. A.V. Topchieva, Moscow, 1987), pp. 4–13.

* cited by examiner

PLASMA PROCESSING METHODS AND APPARATUS

CROSS-REFERENCE TO RELATED APPLICATIONS

The present application is a division of U.S. patent application Ser. No. 08/975,403, filed Nov. 20, 1997, incorporated herein by reference, now U.S. Pat. No. 6,139,678.

STATEMENT REGARDING FEDERALLY SPONSORED RESEARCH

Not Applicable.

BACKGROUND OF THE INVENTION

The present invention relates to processing of materials, and more particularly to plasma processing.

Plasma processing is widely used to modify surface properties of materials. Thus, plasma is used in fabrication of integrated circuits to perform deposition, etch, cleaning, and rapid thermal anneal. Plasma-based surface processes are also used for hardening of surgical instruments and machine tools, and are used in aerospace, automotive, steel, biomedical, and toxic waste management industries. See, for example, M. A. Lieberman and A. J. Lichtenberg, "Principles of Plasma Discharges and Materials Processing" (1994), page 1.

A common goal in a plasma-based process design is uniform treatment of the target surface (i.e. the surface treated with plasma). It is desirable to develop systems in which the uniform processing is facilitated.

In some systems, the target article and the plasma move relative to each other, and it is desirable to facilitate precise control of this relative movement. Further, it is desirable to reduce stresses on the target articles thus reducing the possibility of damaging the target articles.

It is also desirable to increase the productivity of plasma processing systems. A plasma processing system is idle when it is being loaded with articles to be processed or when already processed articles are being unloaded. It is desirable to reduce the idle time of the plasma system.

SUMMARY

Some embodiments of the present invention provide methods and apparatus for moving the target articles relative to the plasma so as to facilitate uniform processing of the target surfaces. In particular, some embodiments facilitate precise control of the movement of the articles relative to the plasma by reducing accelerations of the articles. Reducing the accelerations also results in reduction of stresses to which the articles are subjected.

The inventor has observed that the velocity of the target article as it moves through the plasma may have to be varied to achieve uniform plasma processing. Consider, for example, the dynamic plasma treatment (DPT) system described in Yu. M. Agrikov et al., "Dynamic Plasma Treatment of HIC (Hybrid Integrated Circuit) Substrates", Elektronnaya Tehnika, Ser. 10, 5(71), 1988, pages 30–32, incorporated herein by reference. In that system, a target substrate is moved in and out of the plasma in a chamber maintained at atmospheric pressure. The substrate is moved by a horizontal arm rotating in a horizontal plane. The plasma flows vertically, intersecting the substrate path. The horizontal cross-section of the plasma is smaller than the substrate surface being treated. Therefore, the plasma source moves along the rotation radius to process the whole surface.

Since the substrate points that are located farther from the rotation axis move faster than the points closer to the rotation axis, the points farther from the rotation axis could be exposed to the plasma for less time than the points closer to the axis, resulting in non-uniform processing. One solution to this problem is to vary the angular velocity of the substrate as the plasma source moves along the rotation radius. Thus, when the plasma source is farther from the rotation axis, the angular velocity can be decreased to increase the time that the substrate moves through the plasma.

Another solution is to vary the velocity of the plasma source.

Both solutions need improvement. Thus, varying the angular velocity of the substrate leads to accelerations that make precise control of the angular velocity more difficult to achieve. Further, these accelerations create stresses that may damage the substrate if the substrate is fragile, for example, if the substrate is a semiconductor wafer. Therefore, for this solution, it is desirable to reduce variations of the substrate angular velocity.

Varying the velocity of the plasma source is disadvantageous because accelerations experienced by the plasma relative to immobile ambient gas can change the plasma characteristics and hence make the processing less uniform. Of note, if the processing occurs at atmospheric pressure (as does DPT), even constant-velocity movement of the plasma source can make the plasma difficult to control unless the plasma motion is very slow. Thus, it is desirable to reduce the velocity and acceleration of the plasma source, preferable down to zero.

Accordingly, in some embodiments of the present invention, target surface points that move at different velocities are caused to travel different distances through the plasma so that the faster moving points travel a longer distance. As a result, the time spent in the plasma by faster moving points approaches the time spent by slower moving points. Consequently, the accelerations needed to make the plasma processing uniform are reduced.

In some embodiments, the plasma source is stationary.

In some embodiments, these advantages are achieved as follows. The plasma flow cross-section through which the target article moves is made to have different dimensions in different directions. The target article passes through the plasma multiple times in different directions so that the points moving faster intersect the plasma along a longer dimension of the cross-section than the slower moving points. As a result, uniform treatment can be obtained with less variation of the article velocity.

In some embodiments, the plasma source is stationary. Changing the direction in which the target article intersects the plasma is achieved by rotating the drive that rotates the article so that the article rotates around a first axis which itself rotates around a second axis. The directions change because the article intersects the plasma at different positions of the first axis.

In some embodiments, the idle time of a plasma processing system is reduced by providing two loading devices. While the system processes one article or one lot of articles, one of the loading devices stands ready to unload the system. At the same time, the other loading device is being loaded with the next article or lot of articles to be processed by the system. As soon as the current processing cycle terminates, the processed articles are unloaded into the first device, and the plasma system is loaded from the second device even before the first device is itself unloaded. Meanwhile, the first device carries the processed articles to an appropriate destination, for example, a cassette for semiconductor wafers, unloads the articles, and gets loaded with unprocessed articles. At the same time, the plasma processing system starts processing the articles loaded from the second device, without waiting for the first device. Then the first and second devices switch roles, with the second device waiting to unload articles from the plasma processing system and the first device ready to load unprocessed articles into the system. Because the plasma processing system does not wait for reloading of the first device, the system idle time is reduced.

Other embodiments and variations are discussed below. The invention is defined by the appended claims.

DESCRIPTION OF PREFERRED EMBODIMENTS

Figure 1:
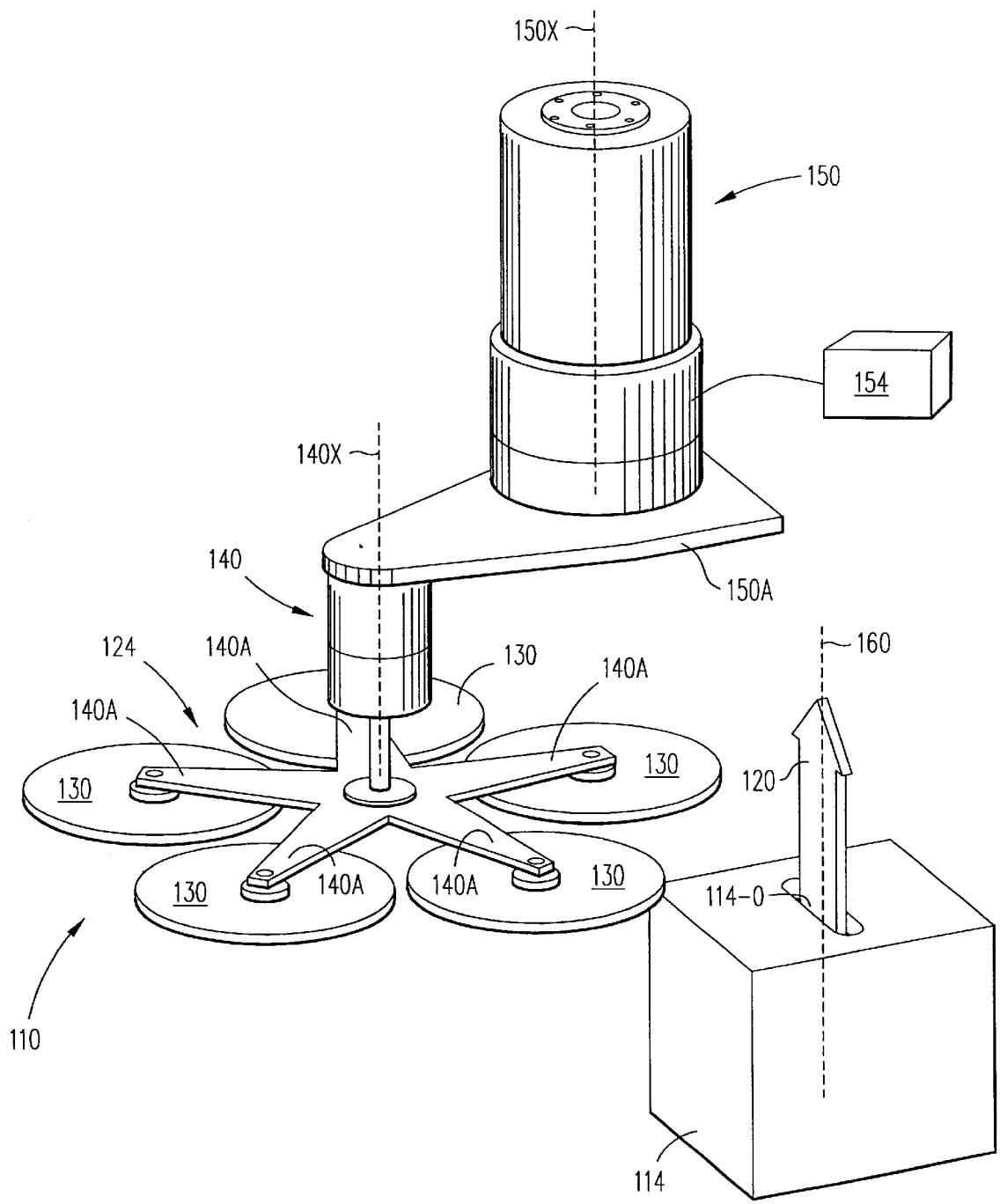
FIG. 1 is a perspective view of a plasma processing system according to the present invention.

In plasma processing system 110 (FIG. 1) plasma source 114 generates plasma jet 120 schematically shown by an arrow. Plasma jet 120 flows vertically upwards through an elongated opening 114-O in source 114. The opening 114-O is elliptical in some embodiments. Horizontal cross sections of plasma jet 120 are also elliptical. In some embodiments, the opening 114-O and the plasma horizontal cross sections have a shape of an elongated rectangle, perhaps with rounded corners.

Carrousel 124 includes five holders 130. Each holder 130 holds an article 134 (FIG. 2) whose bottom surface is processed by plasma jet 120. Articles 134 in FIGS. 1–5 are round semiconductor wafers whose flat horizontal bottom surfaces are processed with plasma 120. In some embodiments, the articles are not round and/or are not semiconductor articles. In some semiconductor-wafer embodiments, holders 130 are non-contact wafer holders such as described, for example, in PCT publication WO 96/21943 "Device For Treating Planar Elements With A Plasma Jet" published Jul. 18, 1996 (inventors I. M. Tokmulin et al.) incorporated herein by reference. In some such embodiments, the plasma processing takes place at atmospheric pressure or at some other pressure close to the atmospheric pressure.

In some embodiments, wafer holders 130 hold the wafers by vacuum or by electrostatic, mechanical, or some other means.

Some embodiments of system 110 have only one holder 130, or some other number of holders.

Each wafer holder 130 is attached to an arm 140A of a first angle drive 140. Angle drive 140 rotates the wafers around vertical axis 140X.

Angle drive 140 is attached to arm 150A of second angle drive 150. Drive 150 rotates around vertical axis 150X.

Control system 154 controls the drives 140 and 150 by conventional means (for example, using a computer).

Figure 2:
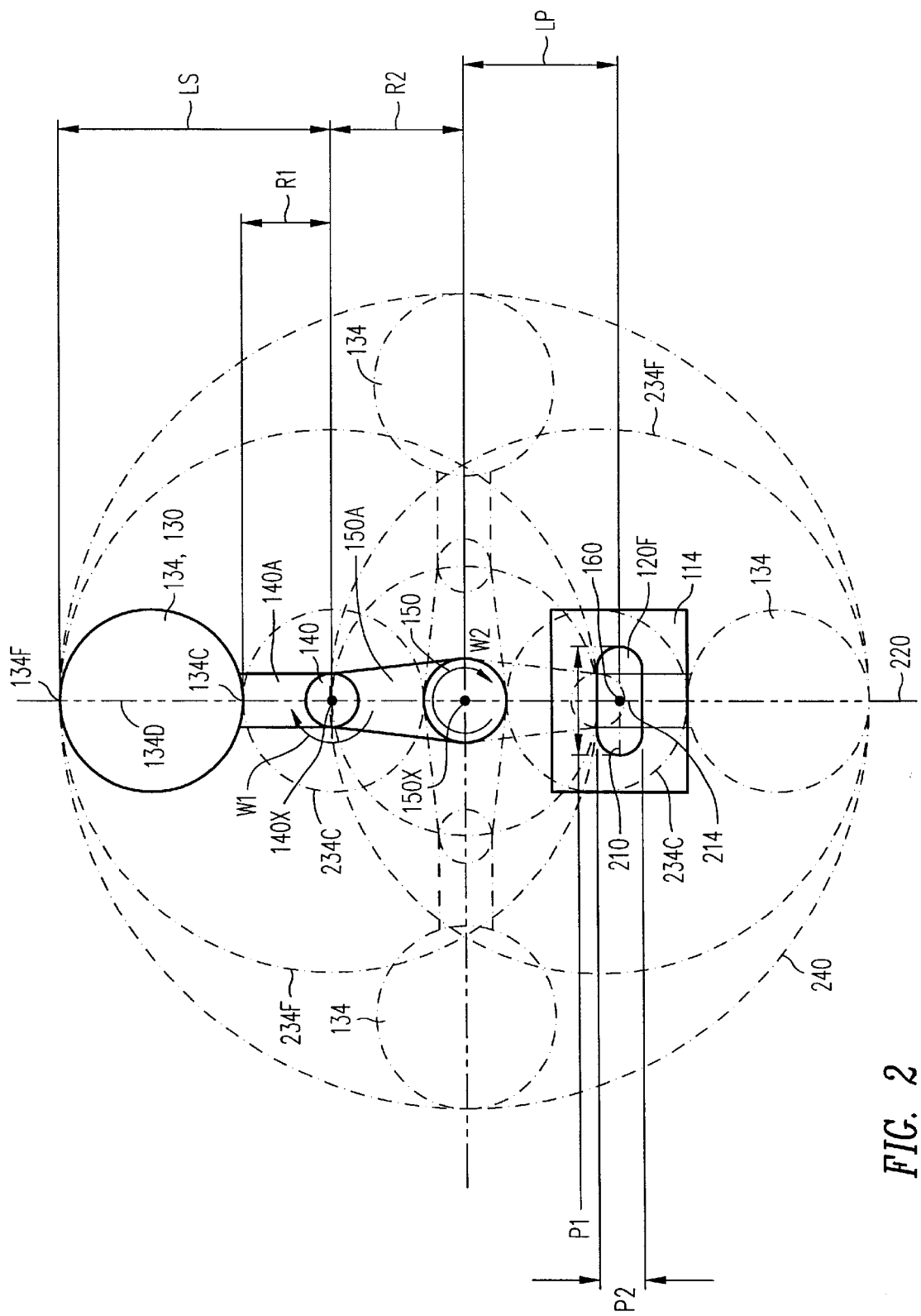
FIGS. 2–4 are top views illustrating wafer trajectories in the system of FIG. 5.
Figure 3:
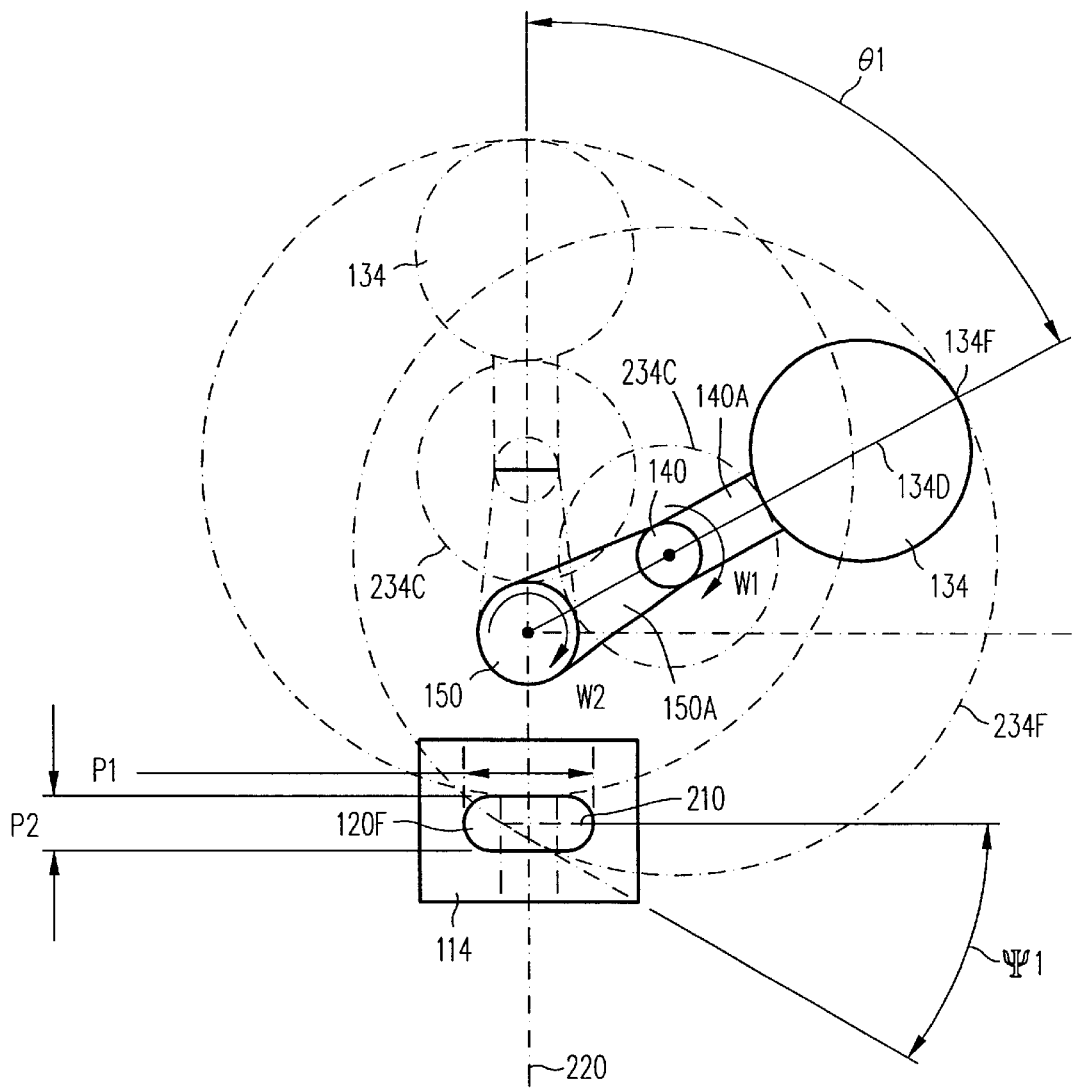
Figure 4:
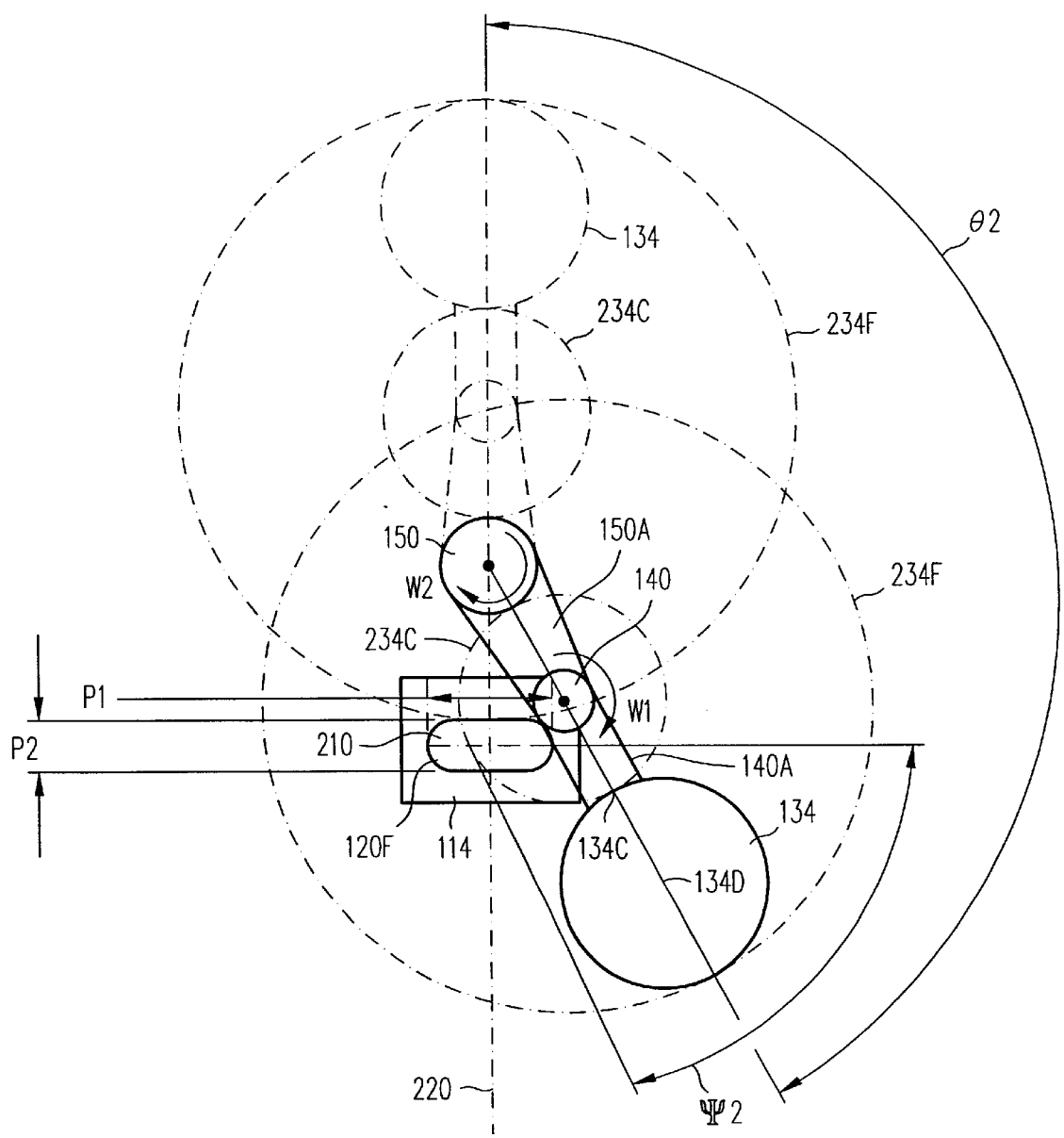

Top view FIGS. 2–4 show different positions of a single wafer 134 during processing.

In some embodiments, plasma source 114 does not move during processing, and therefore the plasma jet is stationary, that is, the plasma jet fills a substantially stationary region in space. However, the plasma source can move vertically and horizontally before processing in order to be positioned at a desired location relative to targets 134 (and, in particular, at a desired distance relative to the targets) as dictated by processing requirements.

Some embodiments of the plasma source are described in U.S. patent application Ser. No. 08/781,568 filed Jan. 9, 1997 by O. Siniaguine and entitled "Plasma Generation and Plasma Processing of Materials", incorporated herein by reference, now U.S. Pat. No. 5,767,627, see also PCT publications WO 92/12610 (Published Jul. 23, 1992), WO 92/12273 (published Jul. 23, 1992), WO 96/21943 (published Jul. 18, 1996), which are incorporated herein by reference.

In some embodiments, the velocity W1 is constant and thus is simple to control. Angular velocity W2 of drive 150 is considerably smaller than W1. In some embodiments, the average angular velocity of drive 150 is ten times smaller than the velocity W1. Therefore, wafers 134 cross the plasma jet multiple times during each revolution of drive 150.

In some embodiments, system 110 is used for dynamic plasma treatment performed at atmospheric pressure such as described, for example, in Yu. M. Agrikov et al., cited above, incorporated herein by reference. The angular velocities W1 and W2 are controlled so that the linear velocities of points being treated with plasma are greater than the speed at which the heat from the plasma propagates through article 130. Consequently, the processing conditions approach the conditions that would exist if the entire target surface were simultaneously exposed to the plasma. In some embodiments described, W1 is a constant velocity of about 5 to 30 revolutions per second, and W2 is much smaller, the average value of W2 being at least 10 times smaller than W1 in some embodiments.

Dynamic plasma treatment is also described in the following articles incorporated herein by reference: P. P. Kulik, "Dynamic Plasma Treatment (DPT) of a Surface of a Solid Body", Plazmohimiya-87, Part 2 (U.S.S.R. Academy of Science, Institut Neftehimicheskogo Sinteza im. A. V. Topchieva, Moscow, 1987), pages 4–13; Yu. M. Agrikov et al., "Foundations of a Realization of a Method of Dynamic Plasma Treatment of a Surface of a Solid Body" (same publication, pages 58–96.)

In some embodiments the plasma processing is performed in vacuum.

FIGS. 1–4 use the following notation:

Numeral 160 denotes a vertical axis that passes through the center of the opening 114-O and plasma jet 120. Axis 160 is a symmetry axis of the opening 114-O, the plasma jet 120, and plasma source 114.

R1 is the distance between axis 140X and the nearest edge point 134C of wafer 134 (all the distances in FIGS. 2–4 are taken between the parallel projections of respective points onto a horizontal plane unless mentioned otherwise).

LS is the distance between the axis 140X and the farthest edge point 134F of wafer 134.

R2 is. the distance between the axes 140X and 150X.

LP is the distance between axis 150X and axis 160 of plasma jet 120.

120F denotes the horizontal cross section of plasma jet 120 at the level of the lower surface of wafer 134. This cross section is called a "plasma footprint" below. The long axis of this elliptical footprint is shown at 210; the short axis is shown at 214. Axis 214 is perpendicular to axis 210.

Short axis 214 lies on axis 220 which intersects the axes 160, 150X in the top view of FIGS. 2–4.

P1 is the length of footprint 120F, and P2 is the width of the footprint.

In FIGS. 2–4, each circle 234C is a trajectory of the wafer point 134C for some position of the axis 140X. Each circle 234F is a trajectory of point 134F for some position of axis 140X. The actual trajectories of points 134C and 134F are not circles because the axis 140X rotates during processing. However, in embodiments in which the angular velocity W2 of drive 150 is small relative to the angular velocity W1 of drive 140, circles 234C, 234F are fair approximations of the actual trajectories of points 134C, 134F.

In FIG. 2, circle 240 is the smallest circle circumscribed around all the circles 234F.

Angles Θ (Θ1 in FIG. 3 and Θ2 in FIG. 4) are angles between the axis 220 and arm 150A (that is, between axis 220 and a horizontal straight line intersecting the vertical axes 150X and 140X). In FIG. 2, Θ=0. Angles Ψ (Ψ1 in FIG. 3, Ψ2 in FIG. 4) are angles between (1) the long axis 210 of plasma footprint 120F and (2) the trajectory of a selected point on wafer 134 where this trajectory intersects the axis 210. The selected point is chosen on the diameter 134D interconnecting the points 134C and 134F. In FIG. 3 (Θ=Θ1), this selected point is 134F. In FIG. 4, the selected point is 134C. Different wafer points are selected for different angles Θ because no single wafer point intersects the plasma footprint at every value of Θ. Of note, in some embodiments, the wafer diameter is 100–300 mm; the length P1 of the footprint 120F is 50–150 mm; the footprint width P2 is 20–50 mm; R1 is about 20–100 mm; R2 is 150–300 mm; LS is 120–400 mm; LP is 150–300 mm.

The trajectory determining the angle Ψ is drawn assuming the arm 150A is stationary. The drawn trajectory is a good approximation of the actual trajectory if the angular velocity W2 of drive 150 is small relative to velocity W1 of drive 140.

In FIG. 2, wafer 134 does not intersect plasma footprint 120F.

Figure 5:
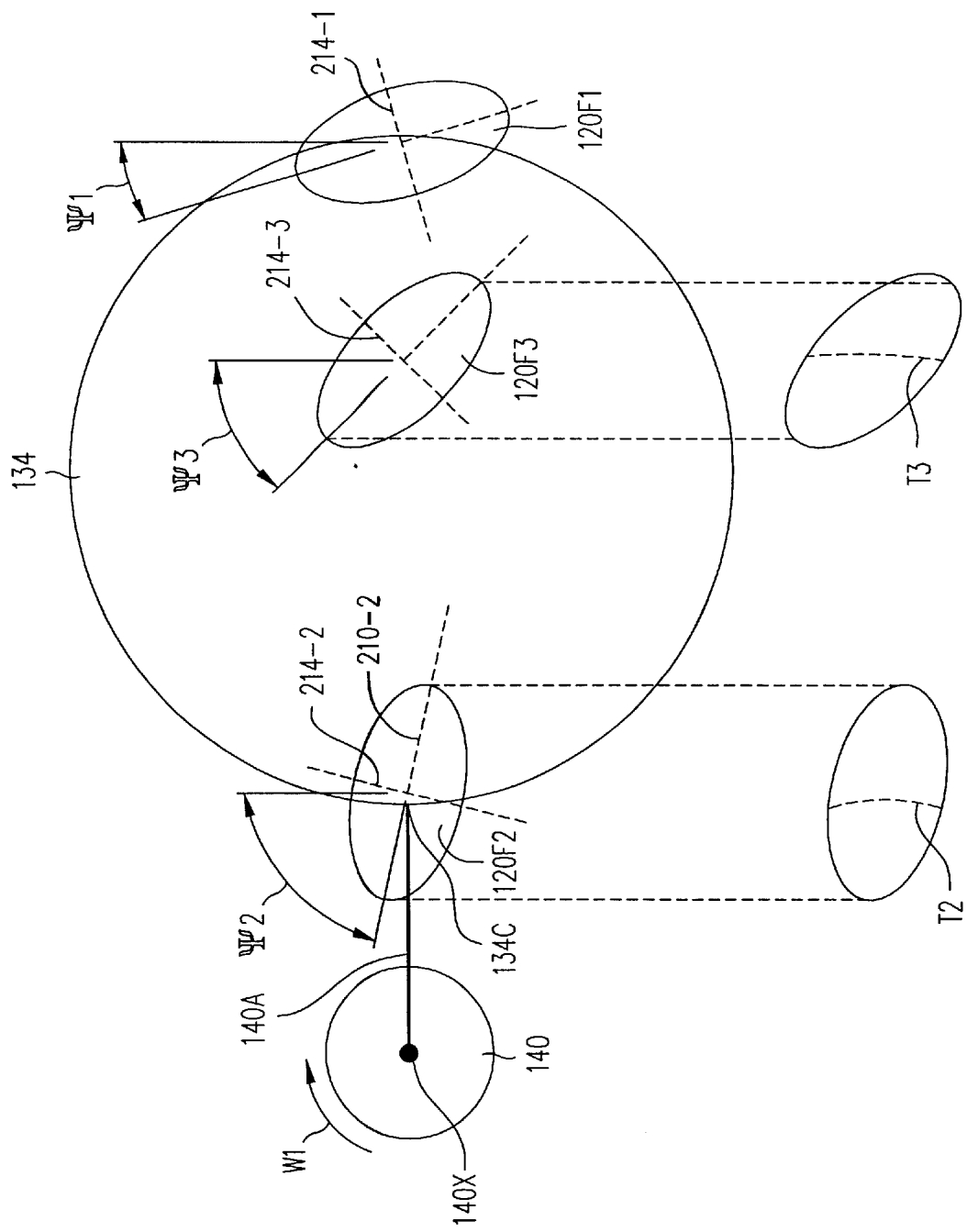
FIG. 5 is a top view illustrating different positions of plasma relative to a wafer in the system of FIG. 1.

As illustrated in FIGS. 2–5, as the arm 150A approaches plasma jet 120 (the angle Θ increases), the intersection of plasma footprint 120F with the wafer 134 approaches the point 134C and axis 140X. In FIG. 5, the ellipse 120F1 shows the position of plasma footprint 120F relative to wafer 134 when Θ=Θ1 (FIG. 3). In that position, the plasma footprint covers the point 134F. The ellipse 120F2 shows the plasma footprint position at Θ=Θ2 (FIG. 4). In that position, plasma footprint 120F covers the point 134C. Ellipse 120F3 shows the position of the plasma footprint 120F when Θ has an intermediate value between Θ1 and Θ2.

As the plasma footprint moves closer to point 134C and to axis 140X, the plasma processes wafer points having lower linear velocities. Indeed, the linear velocity relative to axis 140X (corresponding to the angular velocity W1) decreases because the distance from axis 140X decreases. Since angular velocity W1 is considerably higher than W2, the linear velocity component corresponding to W1 dominates the point's resultant linear velocity.

The decreasing linear velocity tends to increase the plasma processing time for points closer to the point 134C. However, the decreasing linear velocity is at least partially offset by the decreasing length of the points' trajectories through the plasma footprint. For example, the trajectory T2 of point 134C through ellipse 120F2 is shorter than the trajectory T3 of the point passing through the center of ellipse 120F3. The trajectory length decreases because the plasma footprint turns relative to the wafer so that as e increases from 0 to 180°, the angle between short axis 214 of the plasma footprint and the arm 140A increases from about 0 towards 90°. (In FIG. 5, the axis 214 is shown at 214-1, 214-2, 214-3 for respective plasma footprint positions 120F1, 120F2, 120F3. The long axis 210 in the position 120F2 is shown at 210-2.) Since the wafer points travel through the footprint essentially at 90° to arm 140A, their trajectories become shorter.

In some embodiments, the angular velocities W1 and W2 are chosen so that as Θ increases to 180°, each point on wafer 134 passes through footprint 120F several times during several successive revolutions of first drive 140. Thus, successive plasma paths on the wafer surface overlap. When Θ=0 or Θ=180°, wafer 134 does not pass through plasma 120. Therefore, points 134C and 134F pass through the plasma about the same number of times as every other wafer point.

To reduce the probability that different points ay pass a different number of times through the plasma, in some embodiments each article 130 is processed in two or more revolutions of drive 150. In each revolution, the plasma traces a different path on the article surface, thus increasing the processing uniformity. To obtain different plasma paths in different revolutions, the following techniques are used:

I. After each revolution, the drive 150 is stopped for a while in the position Θ=0 (FIG. 2), while the drive 140 continues to rotate. Then drive 150 is restarted at a time when the position of wafer 130 is different from the wafer position at the start of a previous revolution. In some embodiments, the stopping time is a few milliseconds.

II. Alternatively, drive 150 is not stopped at Θ=0, but the velocity W2 is changed near Θ=0 compared with a previous revolution (for example, W2 is increased or decreased by 0.1% when Θ is near 0), so that when e increases to a value at which the wafer 130 starts intersecting the plasma 120, the wafer 130 has a different position from its position for the same Θ in a previous revolution. Such small variations of W2 can be performed with less acceleration of drive 150 than in option I. Further, since drive 150 is not stopped, the processing time is less than in option I. In some embodiments, for Θ near 0, W2 is increased for 2 or 3 revolutions of drive 150, then W2 is decreased for a few revolutions of drive 150, then increased again. In some embodiments, for Θ values at which the wafers 130 intersect the plasma, W2 is the same in each evolution.

III. Velocity W1 of drive 140 is varied slightly (for example, by 0.1%) between different revolutions of drive 150.

The technique III is combined with I or II in some embodiments.

In some variations of techniques I, II, III, W2 and/or W1 are varied when Θ is near 180° and/or 0° and/or some other value.

The technique I has the advantage of allowing the wafer 130 to cool at least part of the way down to its original temperature after each revolution of drive 150, thus allowing the thermal conditions to be similar at each revolution. See PCT Publication WO 96/21943 published Jul. 18, 1996, incorporated herein by reference. In some embodiments, the wafer is stopped for a few seconds at Θ=0 to allow the wafer to cool. If the processing is sensitive to the thermal conditions, velocity W1 is controlled so that the wafer is allowed to cool during each revolution of drive 140.

In FIGS. 2–4, the following relations hold true:

$$R1 \geq P1/2 \quad (1)$$

that is, the distance R1 between the axis 140X and the nearest edge point 134C of wafer 134 is greater than or equal to one half of the length P1 of plasma footprint 120F.

This condition ensures in any revolution of first drive 140, any given point on wafer 134 passes through plasma 120 at most once. This is true even if the axis 140X is close to the axis 160. If the relation (1) did not hold, and the axis 140X were close to plasma 120, some wafer points (for example, 134C) could pass through the plasma twice in a single revolution of drive 140. Other wafer points (such as 134F) would pass through plasma 120 at most once in any revolution of drive 140. Therefore, the plasma processing would be less uniform unless the wafer velocity were doubled for points that pass through the plasma twice during a single revolution of drive 140.

$$R2 \geq R1 \quad (2)$$

that is, the distance between axes 140X and 150X (essentially the length of arm 150A) is greater than the distance between the axis 140X and wafer point 134C.

$$R2-R1 < LP < R2+R1 \quad (3)$$

$$LP+R2 > LS \quad (4)$$

The relations (2), (3), and (4) allow every point of wafer 134 to be processed during a single revolution of drive 150 provided the velocity W2 is sufficiently low relative to W1.

The appendix at the end of this description gives equations that can be used to determine the angular velocity W2. The equations assume that W1 is constant. The equations can be solved using known numerical methods.

Alternatively, W2 can be determined experimentally, for both constant and variable velocities W1, using known iterative techniques. More particularly, when system 110 is being set up, test wafers are processed at some angular velocity $W2_1$ which is the first iterative approximation of the final velocity W2. In some embodiments, velocity $W2_1$ is constant. Then the wafers are examined to determine which points were processed too little relative to other points. For example, if the plasma processing is an etch process, the amount $h_1(r)$ of the material etched at different wafer points is examined, where r is the distance between the wafer point and axis 140X. Suppose that it is desired to etch away the amount $h_0(r)$. (In many processes $h_0(r)$ is independent of r, that is, the same amount of material is to be etched away at every wafer point.) Then the velocity $W2_2(r)$ at the second iterative pass is given by the formula:

$$W2_2(r) = W2_1(r) * h_1(r)/h_0(r).$$

If additional iterations are desired, the velocity W2 at each subsequent iteration can be determined similarly (the more material is removed at a given coordinate r during the previous iteration, the greater is the velocity W2(r) during the next iteration).

These iterations are programmed into the control system 154. In production, the control system 154 causes the system 110 to perform all the iterations.

Figure 6:
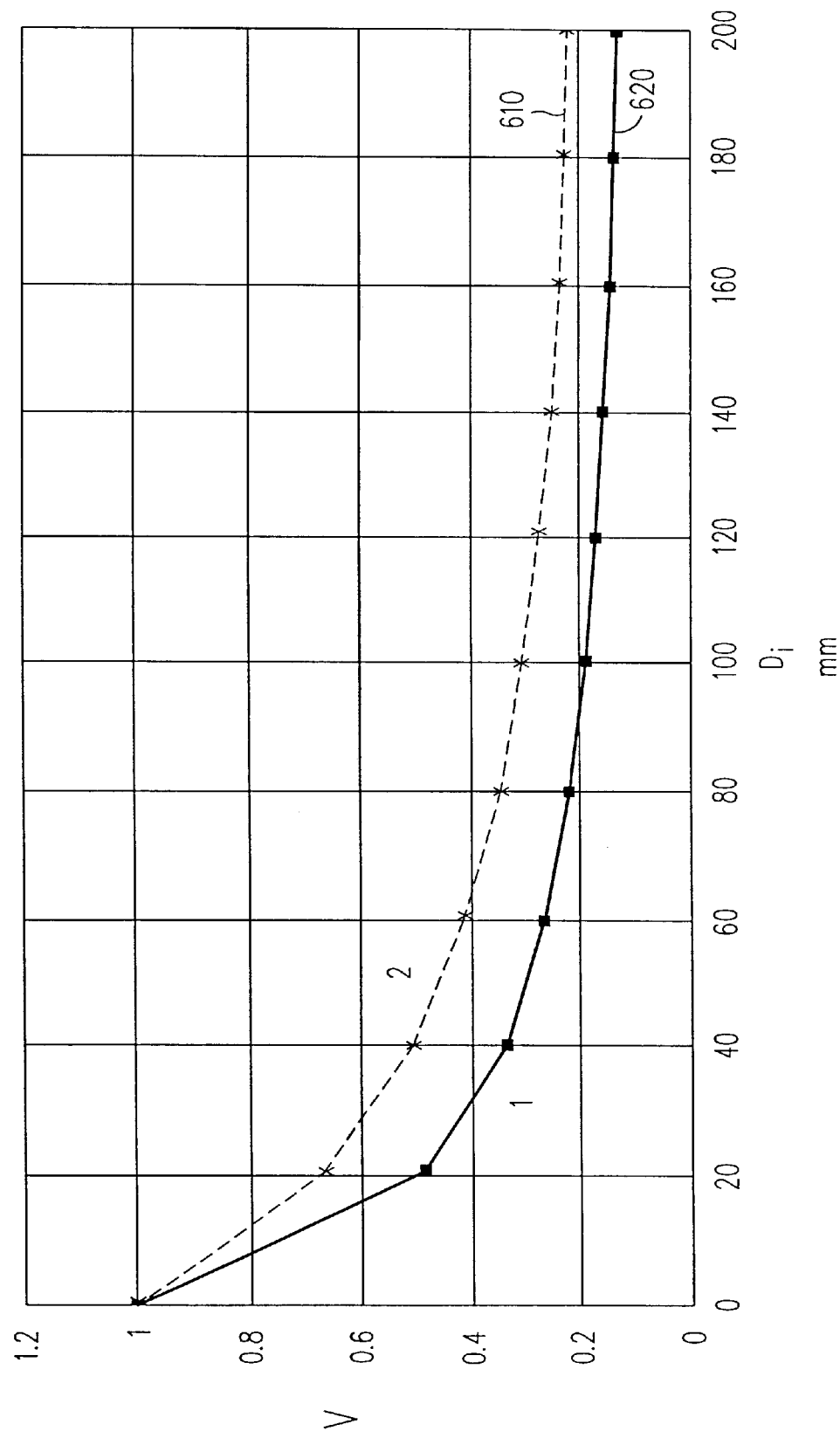
FIG. 6 shows angular velocity graphs for the system of FIG. 1 and for a prior art system.

Because wafer points traveling at a greater linear velocity tend to have longer trajectories through the plasma footprint 120F (see FIG. 5), uniform plasma processing can be achieved with less variation of the angular velocity W2 of drive 150. FIG. 6 illustrates this in one embodiment for a 200 mm wafer. The horizontal axis $D_i$ is the distance between a wafer point P on diameter 134D and the point 134C. The top curve 610 shows the linear velocity V of the center of plasma footprint 120F (axis 160) relative to axis 140X. The velocity units are chosen so that V=1 at $D_i$=0. The velocity V was determined from velocity W2 which in turn was determined from the equations in the appendix.

The bottom curve 620 in FIG. 6 shows the linear velocity V for a prior art apparatus having only the angle drive 150. The first drive 140 is omitted. In that prior art apparatus, the distance between the axis 150X and the nearest wafer point 134C is R2+R1 where R2 and R1 are the dimensions for which the curve 610 was obtained. The linear velocity V was determined from angular velocity W2 which in turn was computed from appropriate equations similar to those given in the appendix. Curves 610 and 620 intersect at $D_i$=0, but the slope magnitude (and hence the acceleration) for curve 610 is smaller than for curve 620. The maximum acceleration (at $D_i$=0) for curve 610 is about two times smaller than for curve 620. Since the angular velocity W2 is proportional to V, the acceleration associated with W2 is also about two times smaller for curve 610.

In some embodiments, the plasma system 110 corresponding to curve 610 performs a back-side etch of wafers or individual dies to reduce the wafer or die thickness to 15–350 $\mu m$ after the circuits on the wafers or the dies have been fabricated. Such thin dies and wafers are suitable for vertical integration modules in which multiple dies are stacked on top of each other and then the whole stack is packaged. See U.S. patent application 60/030,425 "Back-Side Contact Pads" filed by O. Siniaguine on Oct. 29, 1996 and incorporated herein by reference. See also PCT Application PCT/US97/18979 filed Oct. 27, 1997 entitled "Integrated Circuits and Methods for Their Fabrication" incorporated herein by reference. The thin wafers and dies are fragile, and reducing the acceleration in the plasma processing system reduces the possibility of damaging the wafers and dies and thus increases the yield.

Figure 7:
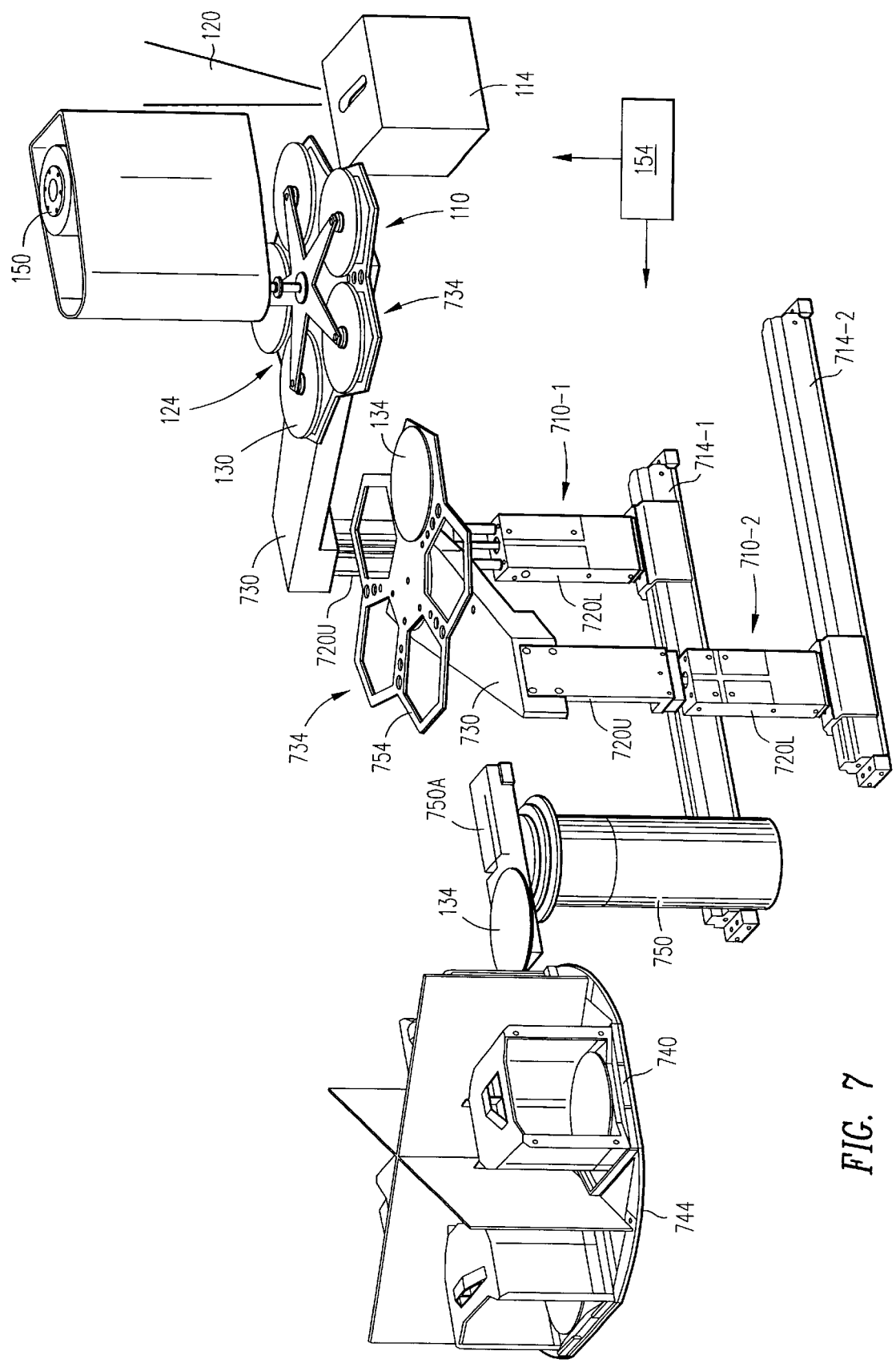
FIG. 7 is a perspective view illustrating wafer loading equipment according to the present invention.

FIG. 7 illustrates a wafer loading system for plasma processing system 110. The loading system includes two shuttles 710-1, 710-2 moving on respective parallel rails 714-1, 714-2. Each shuttle 710 includes a vertical support that contains a lower portion 720L and an upper portion 720U. In each shuttle, one end of horizontal arm 730 is attached to the top of the upper support portion 720U. Horizontal wafer-holding platform 734 is attached to the other end of arm 730. Each platform 734 holds the same number of wafers as carrousel 124 (five wafers in FIG. 7) in the same relative position as the carrousel. Arm 730 can rotate in a horizontal plane around an axis passing through or near the vertical support portion 720U.

One or more rods (not shown) pass through portions 720L, 720U of each shuttle, and the upper portion 720U can slide up and down the rods to raise or lower the respective platform 734. The sliding motion is controlled by a motor (not shown). The capability to move the support portions 720U up or down is used, among other things, to position the platforms 734 of shuttles 710-1, 710-2 at different heights when they move past each other so that the platforms and the arms 730 would not collide.

The system of FIG. 7, including the plasma processing system 110, the shuttles 710, robot 750, and the chamber door (not shown), are controlled by a computer-based control system 154 which includes appropriate sensors and transducers. Making and using such a control system is within the skill of the art.

Plasma processing system 110 is located in a chamber (not shown) separated from the shuttles by a door (not shown). During plasma processing, one of the shuttles, for example, shuttle 710-1, waits behind the door ready to unload the wafers from system 110. The other shuttle (710-2 in the example being described) is loaded with wafers from cassettes 740 in cassette holder 744. The loading operation is performed by a robot 750 which loads five unprocessed wafers one by one onto platform 734 of shuttle 710-2. (The wafers are loaded by the robot arm 750A.) When the plasma processing terminates, the door (not shown) separating the system 110 from the shuttles opens. Shuttle 710-1 moves its empty platform 734 under and up towards carrousel 124 so that each wafer carrier 754 of the platform becomes positioned below one of wafer holders 130 of system 110. The wafers are dropped onto the platform 734 of shuttle 710-1. Shuttle 710-1 moves on rail 714-1 towards cassette holder 744, and robot 750 starts unloading the processed wafers. Meanwhile, shuttle 710-2 moves on rail 714-2 towards system 110. Platform 734 of shuttle 710-2 gets positioned below the carrousel 124 so that each wafer 134 on shuttle 710-2 is positioned under one of wafer holders 130 (about 3 mm under the wafer holders for some non-contact wafer holders). The wafers get loaded into the wafer holder 130, shuttle 710-2 moves away, the door of the plasma processing chamber closes, and the plasma processing begins. Plasma processing proceeds in parallel with shuttle 710-1 being unloaded and then reloaded with unprocessed wafers. Then the shuttles 710-1, 710-2 switch roles. The productivity of the plasma processing system is therefore increased. In some embodiments, the system 110 is used 90% of the time, and idle only 10%.

In some embodiments, each holder 130 holds an individual die or some other article rather than a wafer.

The above embodiments illustrate but do not limit the invention. The invention is not limited by any particular shape or type of platforms 734, carrousel 124, cassettes 740, cassette holder 744, robot 750, articles 130, plasma source 114, or any other equipment. The invention is not limited to any particular shape or size of opening 114-O or plasma footprint 120F. In some embodiments, the shape and dimensions of opening 114-O vary during processing. In some embodiments, the velocity W1 varies during processing. In some embodiments, drive 140 is omitted. Plasma source 114 moves radially along a rotation radius of drive 150, and the opening 114-O rotates at the same time so that the plasma footprint 120F moves relative to the wafer as shown in FIG. 5. Some embodiments are used to process articles other than semiconductor dies or wafers, for example, surgical instruments or machine tools. Other embodiments and variations are within the scope of the invention as defined by the appended claims.

APPENDIX $$W2(t) = \partial\Theta/\partial t$$

$$\int_0^T W2(t)dt = 2\pi$$

$$P(r1) = (1/2) * \pi * r1 * \int_0^T \int_0^{2\pi} p(\rho(\beta), \varphi(t, \beta))dt d\beta,$$

$$R1 \le r1 \le LS$$

$$\rho(\beta) = (R2^2 + r1^2 - 2*R2*r1*\cos(\beta))^{1/2} \varphi(t,\beta) = \Theta(t) + \cos^-((R2^2 + \rho^2(\beta) - r1^2)/(2*R2*\rho(\beta)))$$

where:
t is time; T is the duration of one revolution of second drive 150;
P(r1) is the desired process result on the surface of the wafer 134 along the radius r1 of the first drive 140;
p(ρ(β),φ(t,β)) is the distribution of the plasma treatment intensity within the plasma footprint 120F at the surface of wafer 134 at a point having polar coordinates (ρ,φ) in the polar coordinate system having an origin on the axis 150X;
β is the angular position of the arm 140A relative to any predetermined direction in the plane of wafer 130 (i.e. perpendicular to rotation axes 140X, 150X).

What is claimed is:

1. A method for processing an article with plasma the method comprising:
   generating plasma; and
   moving the article and the plasma relative to each other such that, for at least a fist point and a second point on the article, the first point moves through the plasma at a greater linear velocity relative to the plasma than the second point, but the first point moves a longer distance through the plasma than the second point;
   wherein moving the article comprises rotating the article around a first axis as the first axis rotates around a second axis, wherein the distance between the first and second axes is smaller than the distance between the first axis and the farthest point on the article surface to be treated with the plasma.

2. The method of claim 1 wherein moving the article and the plasma relative to each other comprises moving the article while a plasma source generating the plasma is stationary.

3. The method of claim 1 wherein the plasma processing occurs at atmospheric pressure.

4. The method of claim 1 wherein the plasma region through which the article passes is elliptical or has a shape of an elongated rectangle with or without rounded corners.

5. The method of claim 1 wherein the first axis makes at least two revolutions around the second axis such that the plasma traces a different path on the article surface during each of the two revolutions.

6. The method of claim 5 wherein in each of the two revolutions of the first axis around the second axis, the article makes at least two revolutions around the first axis such that the path traced by the plasma on the article surface during one of the two revolutions of the article around the first axis overlaps with the path traced by the plasma on the article surface during the other one of the two revolutions of the article around the first axis.

7. The method of claim 5 wherein the angular velocity of the article relative to the first axis in one of the two revolutions of the first axis around the second axis is different from the angular velocity of the article relative to the first axis in the other one of the two revolutions of the first axis around the second axis.

8. The method of claim 5 wherein each of the two revolutions of the first axis around the second axis starts with a different position of the article for the same position of the first axis relative to the second axis.

9. The method of claim 1 wherein as the first axis moves through a first portion of its path around the second axis, the plasma traces a first path on the article surface, the first path covering the article surface being processed, and as the first axis moves through a second portion of its path around the second axis, the plasma traces a second path on the article surface, the second path covering the article surface being processed, wherein the first path is different from the second path.

10. The method of claim 9 wherein the angular velocity of the article relative to the first axis in the first portion of the path is different from the angular velocity of the article relative to the first axis in the second portion of the path.

11. The method of claim 9 wherein in each of the first and second portions of the path the first axis rotates around the second axis by about 180°.

12. The method of claim 1 wherein the first axis is spaced from the article.

13. The method of claim 1 wherein:

R1≧P1/2, where R1 is the distance between the first axis and the closest point on the article surface treated with the plasma, and P1 is the longest dimension of the plasma cross-section in a plane in which the article moves;

R2>R1, where R2 is the distance between the first and second axes;

R2−R1<LP<R2+R1, where LP is the distance between the second axis and the center of the plasma cross-section in the plane in which the article moves; and LP+R2>LS, where LS is the distance between the first axis and the farthest point on the article surface treated with the plasma.

14. The method of claim 1 wherein the article surface treated with the plasma is larger than a plasma footprint on the article.

15. The method of claim 1 wherein the article is a semiconductor die or wafer.

16. A method for processing an article with plasma, the method comprising:

generating plasma; and moving the article in and out of the plasma by rotating the article around a first axis spaced from the article as the first axis rotates around a second axis spaced from the article.

17. The method of claim 16 wherein the article surface treated with the plasma is larger than a plasma footprint on the article.

18. The method of claim 17 wherein the distance between the first and second axes is smaller than the distance between the first axis and the farthest point on the article surface to be treated with the plasmna.

19. The method of claim 17 wherein the plasma region through which the article passes is elliptical or has a shape of an elongated rectangle with or without rounded corners.

20. The method of claim 17 wherein the first axis makes at least two revolutions around the second axis such that the plasma traces a different path on the article surface during each of the two revolutions.

21. The method of claim 20 wherein in each of the two revolutions of the first axis around the second axis, the article makes at least two revolutions around the first axis such that the path traced by the plasma on the article surface during one of the two revolutions of the article around the first axis overlaps with the path traced by the plasma on the article surface during the other one of the two revolutions of the article around the first axis.

22. The method of claim 20 wherein the angular velocity of the article relative to the first axis in one of the two revolutions of the first axis around the second axis is different from the angular velocity of the article relative to the first axis in the other one of the two revolutions of the first axis around the second axis.

23. The method of claim 20 wherein each of the two revolutions of the first axis around the second axis starts with a different position of the article for the same position of the first axis relative to the second axis.

24. The method of claim 17 wherein as the fist axis moves through a first portion of its path around the second axis, the plasma traces a first path on the article surface, the first path covering the article surface being processed, and as the first axis moves through a second portion of its path around the second axis, the plasma traces a second path on the article surface, the second path covering the article surface being processed, wherein the first path is different from the second path.

25. The method of claim 24 wherein the angular velocity of the article relative to the first axis in the first portion of the path is different from the angular velocity of the article relative to the first axis in the second portion of the path.

26. The method of claim 24 wherein in each of the first and second portions of the path the first axis rotates around the second axis by about 180°.

27. The method of claim 17 wherein:

R1≧P1/2, where R1 is the distance between the first axis and the closest point on the article surface treated with the plasma, and P1 is the longest dimension of the plasma cross-section in a plane in which the article moves;

R2>R1, where R2 is the distance between the first and second axes;

R2−R1<LP<R2+R1, where LP is the distance between the second axis and the center of the plasma cross-section in the plane in which the article moves; and LP+R2>LS, where LS is the distance between the first axis and the farthest point on the article surface treated with the plasma.

28. The method of claim 16 wherein the article is a semiconductor die or wafer.

* * * * *